(12) United States Patent
Pawlak et al.

(10) Patent No.: US 7,785,993 B2
(45) Date of Patent: Aug. 31, 2010

(54) METHOD OF GROWING A STRAINED LAYER

(75) Inventors: Bartlomiej J Pawlak, Heverlee (BE); Philippe Meunier-Beillard, Kortenberg (BE)

(73) Assignee: NXP B.V., Eindhoven (NL)

( * ) Notice: Subject to any disclaimer, the term of this patent is extended or adjusted under 35 U.S.C. 154(b) by 517 days.

(21) Appl. No.: 11/718,488

(22) PCT Filed: Oct. 28, 2005

(86) PCT No.: PCT/IB2005/053523

§ 371 (c)(1),
(2), (4) Date: May 2, 2007

(87) PCT Pub. No.: WO2006/048800

PCT Pub. Date: May 11, 2006

(65) Prior Publication Data

US 2009/0042374 A1 Feb. 12, 2009

(30) Foreign Application Priority Data

Nov. 2, 2004 (GB) .................................. 0424290.5

(51) Int. Cl.
*H01L 21/265* (2006.01)

(52) U.S. Cl. ........................ 438/518; 438/478; 438/510; 257/E21.324; 257/E21.335; 257/E29.056; 257/E21.334

(58) Field of Classification Search ................. 438/518, 438/478, 510, 514, 584, 522; 257/E21.324, 257/E21.335, E29.056, E21.334
See application file for complete search history.

(56) References Cited

U.S. PATENT DOCUMENTS

| | | |
|---|---|---|
| 6,703,293 B2 | 3/2004 | Tweet et al. |
| 6,825,102 B1 * | 11/2004 | Bedell et al. ................ 438/486 |
| 2004/0075106 A1 * | 4/2004 | Takenaka .................... 257/192 |
| 2004/0087119 A1 | 5/2004 | Maa et al. |
| 2004/0115888 A1 | 6/2004 | Chang |
| 2005/0064686 A1 * | 3/2005 | Chidambarrao et al. ..... 438/518 |

* cited by examiner

*Primary Examiner*—Davienne Monbleau
*Assistant Examiner*—Shweta Mulcare

(57) ABSTRACT

A method of forming a Si strained layer 16 on a Si substrate 10 includes forming a first SiGe buffer layer 12 on the Si substrate 10. Then, the first SiGe buffer layer is implanted with an amorphising implant to render the first SiGe buffer layer amorphous using ion implantation. A second SiGe buffer layer 14 is grown on the first SiGe buffer layer after annealing. This produces a relaxed SiGe layer 12, 14. Then, the strained layer of Si 16 is grown.

16 Claims, 1 Drawing Sheet

Raman spectroscopy

METHOD OF GROWING A STRAINED LAYER

Figure 1:
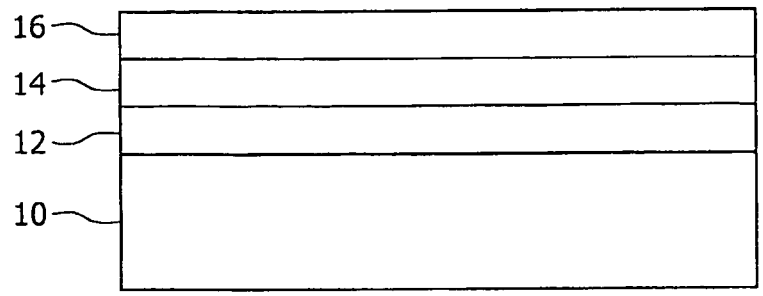

The invention relates to a method of growing a semiconductor device structure, particularly a strained layer structure.

Strained silicon layers have been proposed, for example in new CMOS semiconductor devices, to enhance the mobility of carriers. Such strained layers may be grown by deposition of an epilayer on a buffer layer such as of SiGe.

For example, US2004/0115888 describes a manufacturing method for a semiconductor device in which a SiGe layer and a strained Si layer are sequentially formed on a semiconductor substrate. Both the SiGe layer and the strained Si layer are formed by ultra-high vacuum chemical vapour deposition (UHV-CVD). A gate oxide layer and gate are formed on top of the strained Si layer.

US2004/0087119 describes a method in which a strained SiGe layer is formed. The SiGe layer is strained since it is lattice matched with the substrate. Hydrogen is then implanted. Microwave radiation is used to relax the strained SiGe layers. A strained layer of Si is then grown on the top.

U.S. Pat. No. 6,703,293 teaches a method in which hydrogen ions are implanted into a SiGe film on a Si substrate at a temperature above a critical temperature to form a layer having a high density of hydrogen below the SiGe layer. Then, the SiGe layer is rendered amorphous by a further ion implantation above a critical temperature. The critical temperature is reported to be about 155° C. Then, a high temperature anneal is performed to recrystallise the SiGe film as a relaxed film. Preferably, a Si cap may be grown on top of the SiGe before the high temperature anneal. The Si cap may be used as a seed layer for the recrystallisation.

However, there remains a need for improved methods of growing relaxed SiGe layers, and a further need to grow improved Si strained layers.

According to the invention there is provided a method of manufacturing a semiconductor device, including:

forming a first SiGe buffer layer on a crystalline Si lower layer to form an intermediate semiconductor stage having a first major surface on the first SiGe buffer layer and a SiGe/Si boundary between the first SiGe buffer layer and the Si lower layer;

implanting the first major surface of the intermediate semiconductor stage with an amorphising implant to render the first SiGe buffer layer amorphous, the amorphising implant rendering the intermediate semiconductor stage amorphous from the first major surface towards the substrate as far as an end of range region, the end of range region having a higher defect density, and being above a crystalline region of lower defect density;

regrowing the first SiGe buffer layer above the end of range region to form a relaxed SiGe layer.

The method is able to provide a highly relaxed SiGe buffer which can accordingly provide a high strain in the Si strained layer.

The method has the particular benefit of not requiring complex process steps, and can be readily implemented in existing process flows.

The method according to the invention introduces a locally high density of defects in the end-of range (EOR) region just below the amorphous layer. The defect density in the EOR region is higher than in the crystalline region, including the bulk of the Si layer. Defects in this end of range region relax the layer above after it is regrown. The low temperature regrowth recrystallises the initially amorphous region, and without the EOR region the recrystallisation could easily simply regrow a strained SiGe layer. However, with the high defect density EOR region, regrowth of a good relaxed SiGe layer is possible.

The method differs from that of U.S. Pat. No. 6,703,293 in that in U.S. Pat. No. 6,703,293 a buried amorphous SiGe layer is formed, i.e. in that case there remains a layer of crystalline SiGe above the amorphized SiGe and recrystallisation will accordingly start from the crystalline SiGe layer above the amorphous SiGe layer as well as from below, which will introduce mismatch dislocations in the middle of the SiGe layer where the crystal growth from above meets that from below.

In U.S. Pat. No. 6,703,293 the recrystallization is carried out at high temperatures (650° C. to 1000° C.). It is a further particular benefit of the invention that no high temperature processing is required—the amorphization may be carried out at low temperature and the regrowth can be at 700° C. or less, down to 550° C. if required.

The invention has a further advantage over the approaches presented in U.S. Pat. No. 6,703,293 and US2004/0087119 which both use a hydrogen implantation lo step. The use of H+ as an implant as described in that document forms bubbles and induces local defects in the SiGe throughout the SiGe layer which then relax the SiGe. In contrast, in the invention, the Ge is used to create a high density of defects in the Si EOR region which then creates relaxed SiGe. The method according to the invention has the advantage of not using H+ ions which would create hydrogen bubbles in the SiGe layer. Such bubbles can be exhausted in subsequent post-processing, especially in thermal post processing, creating process difficulties and unwanted hydrogen.

The amorphous first SiGe layer may regrow preferentially from the top down in a stage where there is no cap layer which ensures that the regrown SiGe is as relaxed as possible. In contrast, arrangements such as that described in US2004/0115888 in which SiGe is regrown in a stage with a Si cap layer present will regrow SiGe from the Si cap layer which will inherently have a different lattice constant and so will introduce some strain into the SiGe layer.

Preferably, the method further includes the step of growing a strained epilayer of Si on the SiGe buffer layer after regrowth. CMOS and other devices may then be formed in the strained Si layer.

Preferably the step of amorphizing is carried out at a temperature below 100° C., further preferably below 60° C., further preferably at room temperature.

Prereferably, the amorphous/crystalline boundary between the crystalline and amorphous semiconductor between the region of the intermediate semiconductor stage that is rendered amorphous and the end of range region is very close to the materials boundary between the Si lower layer and the SiGe buffer layer. Accordingly, the amorphous/crystalline boundary is preferably within a distance to the material boundary of 20% of the thickness of the SiGe buffer layer, preferably within 10%, 5% or even more preferably 2% of this thickness.

Accordingly, in preferred embodiments the step of implanting is carried out such that the end of range region includes the boundary between the first SiGe buffer layer and the Si lower layer.

Preferably, the method further comprises epitaxially growing a second SiGe buffer layer on the first SiGe buffer layer after the step of regrowing the SiGe buffer layer.

If required, the method may include removing oxide from the first SiGe buffer layer after regrowing the first SiGe buffer layer and before the step of growing the second SiGe buffer layer.

The Si crystalline layer may be is an Si substrate.

A preferred amorphising implant is Ge, Si, As, Ar or Xe.

In embodiments, the amorphising implant is Ge implanted at an energy of 20 keV to 400 keV and a dose in the range $2 \times 10^{14}$ to $3 \times 10^{15}$ cm$^{-2}$.

The step of regrowing the SiGe buffer may be carried out at a temperature of 500° C. to 700° C.

In particular embodiments, the step of regrowing the SiGe buffer is carried out at a temperature of 600° C. to 700° C. for a time of 1 to 10 minutes.

Figure 2:
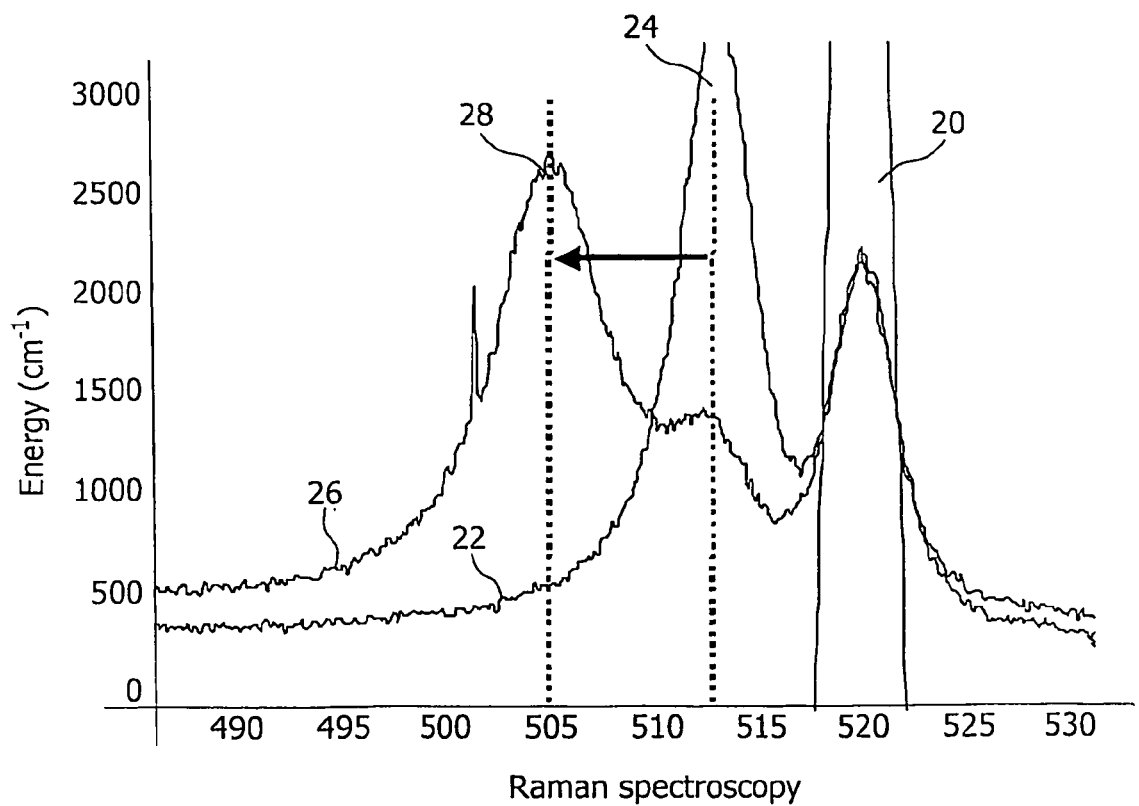

Embodiments of the invention will now be described, purely by way of example, with reference to the accompanying drawings, in which:

FIG. 1 shows a side view of a structure according to an embodiment of the invention; and FIG. 2 shows Raman spectra of a SiGe layer obtained using the method of an embodiment of the invention and a comparative example in which the ion implantation step is omitted.

Referring to FIG. 1, a method of manufacture of a semiconductor device in an embodiment of the invention starts with a silicon substrate 10.

A first SiGe buffer layer 12 is epitaxially grown on top of the silicon substrate 10 to a thickness from 50 nm to 500 nm to form an intermediate semiconductor stage. The Ge content in the buffer layer is in the range 5% to 50%. In this stage, the SiGe layer will be strained, i.e. it will not have its natural lattice constant.

The intermediate semiconductor stage is then placed within the chamber of ion implantation apparatus and Ge is implanted at an energy in the range 20 keV to 400 keV and a dose of $2 \times 10^{14}$ cm$^{-2}$ to $3 \times 10^{15}$ cm$^{-2}$. This implantation has the effect of amorphizing the first SiGe buffer layer 12 as far as an amorphous crystalline boundary. Just below the boundary is an end of range (EOR) region with a significant number of defects, above a crystalline layer with a lower number of defects. The amorphization step will thus have the effect of providing EOR defects, which are expected to be located around the interface between the Si substrate 10 and the SiGe buffer 12.

This amorphization step may be carried out at room temperature which is technically very simple.

The amorphization step in the embodiment amorphizes the SiGe layer 12 throughout its thickness, i.e. from the top down to the inteface with the Si substrate 10. Preferably, the interface between the amorphous and crystalline semiconductor is inside the SiGe buffer close to the Si/SiGe interface. In this case an end-of range region rich in defects should overlap with the Si/SiGe interface.

Next, the amorphized SiGe buffer layer is regrown at a relatively low temperature. The length of time required for this regrowth step will vary with the temperature chosen. In typical cases, at 700° C., a regrowth time between 30 seconds and 2 minutes may be preferred. At 650° C., typical regrowth times will be 2 to 3 minutes. At 600° C., typical regrowth times will be 3 to 10 minutes. It is possible to regrow even at lower temperatures, for example 550° C. or even lower, if a suitable length of time is taken. These temperatures may vary in different process conditions and the skilled person will be able to determine suitable temperatures and times in such different process conditions.

The relatively low temperature regrowth should localise the EOR defects and thereby allow the formation of a regrown SiGe layer 12 without strain.

Since the regrowth step may have allowed oxide to form on the surface the oxide may be stripped as the next step, for example by carrying out a brief reactive ion etch (RIE) step.

A second SiGe buffer layer 14 is then epitaxially grown on the first SiGe buffer layer 12.

Optionally, a high thermal budget thermal anneal may be provided at this point, but this may conveniently be omitted.

Next, a silicon layer 16 is grown on top of the SiGe layer 12, 14. The Si 16 layer is strained.

The inventors have carried out Raman experiments to determine the effect of the method according to the embodiment on the strain in the SiGe layer. Results are presented in FIG. 2 for an amorphization step using Ge applied at 75 keV and a dose of $1 \times 10^{15}$ cm$^{-2}$. The Si peak 20 at 520 is used as a reference. Graph 22 shows the spectrum before regrowth, dominated by the SiGe peak 24 at around 513. The Raman spectrum after regrowth at a 700° C. for one minute is shown by graph 26, with peak 28 at 505. This shows that after regrowth the SiGe layer is fully relaxed.

The embodiment offers several advantages. Firstly, it improves the relaxation and hence can deliver a higher strain in the Si layer 16, thereby improving device properties.

Secondly, the process is easy to integrate into existing process flows and in particular does not require new process steps.

After creating the strained layer processing may continue to form gates, sources and drains to create transistors such as CMOS transistors and other components. Those skilled in the art will appreciate that there are many different process steps that can be employed in this way and these will not be described further.

The invention claimed is:

1. A method of manufacturing a semiconductor device, including:
    forming a first SiGe buffer layer on a crystalline Si lower layer, wherein the crystalline Si lower layer is the substrate of the semiconductor device, wherein the first SiGe buffer layer has a first major surface opposite a SiGe/Si boundary between the first SiGe buffer layer and the Si lower layer;
    implanting the first major surface with an amorphising implant that renders a portion of the first SiGe buffer layer amorphous, wherein the thickness of the amorphized portion of the first SiGe buffer layer is 80%-90% of the thickness of the first SiGe buffer layer from the first major surface and
    regrowing the amphorized first SiGe buffer layer to form a relaxed SiGe layer.

2. The method according to claim 1 further comprising growing a strained epilayer of Si on the relaxed SiGe layer.

3. The method according to claim 1, wherein the step of amorphizing is carried out at a temperature below 100° C.

4. The method according to claim 1, wherein the step of regrowing the amphorized first SiGe buffer layer is carried out at a temperature of about 500° C. to about 700° C. for a time of 30 seconds to 30 minutes.

5. The method according to claim 1, further comprising epitaxially growing a second SiGe buffer layer on the amphorized first SiGe buffer layer after the step of regrowing the amphorized first SiGe buffer layer.

6. The method according to claim 5, wherein regrowing the amphorized first SiGe buffer layer comprises forming oxide on the amphorized first SiGe buffer layer, the method further comprising removing the oxide from the amphorized first SiGe buffer layer after regrowing the amphorized first SiGe buffer layer and before the step of growing the second SiGe buffer layer.

7. The method according to claim 1, wherein the amorphising implant is Ge, Si, As, Ar or Xe.

8. The method according to claim 7, wherein the amorphising implant is Ge implanted at an energy of 20 keV to 400 keV and a dose in the range about $2\times10^4$ to about $3\times10^{15} cm^{-2}$.

9. The method according to claim 8, wherein the step of regrowing the amphorized first SiGe buffer layer is carried out at a temperature of about 500° C. to about 700° C. for a time of 30 seconds to 30 minutes.

10. A method of manufacturing a semiconductor device, including:
   forming a first SiGe buffer layer on a crystalline Si lower layer, wherein the crystalline Si lower layer is the substrate of the semiconductor device, wherein the first SiGe buffer layer has a first major surface opposite a SiGe/Si boundary between the first SiGe buffer layer and the Si lower layer;
   implanting the first major surface with an amorphising implant that renders a portion of the first SiGe buffer layer amorphous, wherein the thickness of the amorphized portion of the first SiGe buffer layer is 80%-90% of the thickness of the first SiGe buffer layer from the first major surface;
   regrowing the amphorized first SiGe buffer layer to form a relaxed SiGe layer, wherein regrowing the amphorized first SiGe buffer layer comprises forming oxide on the amphorized first SiGe buffer layer;
   epitaxially growing a second SiGe buffer layer on the amphorized first SiGe buffer layer after the step of regrowing the amphorized SiGe buffer layer;
   growing a strained epilayer of Si directly on the second SiGe buffer layer; and
   removing the oxide from the amphorized first SiGe buffer layer after regrowing the amphorized first SiGe buffer layer and before the step of growing the second SiGe buffer layer.

11. The method according to claim 10, wherein the step of amorphising is carried out at a temperature range of about 60° C. to about 20° C.

12. The method according to claim 10, wherein the step of regrowing the amphorized first SiGe buffer layer is carried out at a temperature of about 600° C. to about 700° C. for a time in the range of about 30 seconds to about 10 minutes.

13. The method according to claim 10, wherein the amorphising implant is Ge, Si, As, Ar or Xe.

14. The method according to claim 10, wherein the amorphising implant is Ge implanted at an energy of 20keV to 400keV and a dose in the range about $2\times10^4$ to about $3\times10^{15}$ $cm^{-2}$.

15. The method according to claim 14, wherein the amorphising implant is Ge implanted at an energy of about 75KeV and a dose of about $1\times10^{15}$ $cm^{-2}$.

16. The method according to claim 15, wherein the step of regrowing the amphorized first SiGe buffer layer is carried out at a temperature of about 650° C. in the range of about 2 to 3 minutes.

* * * * *